United States Patent [19]

Gartman

[11] 4,000,020
[45] Dec. 28, 1976

[54] VAPOR EPITAXIAL METHOD FOR DEPOSITING GALLIUM ARSENIDE PHOSPHIDE ON GERMANIUM AND SILICON SUBSTRATE WAFERS

[75] Inventor: William Wesley Gartman, Garland, Tex.

[73] Assignee: Texas Instruments Incorporated, Dallas, Tex.

[22] Filed: Oct. 17, 1975

[21] Appl. No.: 623,283

Related U.S. Application Data

[63] Continuation of Ser. No. 355,611, April 30, 1973, abandoned.

[52] U.S. Cl. .............................. 148/175; 156/610; 156/612; 357/16; 357/17
[51] Int. Cl.² ................... H01L 21/20; H01L 29/26
[58] Field of Search .......... 148/174, 175; 156/610, 156/612; 357/16, 17

[56] References Cited

UNITED STATES PATENTS

| | | | |
|---|---|---|---|
| 3,309,553 | 3/1967 | Kroemer | 357/16 X |
| 3,663,319 | 5/1972 | Rose | 148/175 |
| 3,723,201 | 3/1973 | Keil | 148/175 |
| 3,745,423 | 7/1973 | Kasano | 148/175 X |
| 3,769,104 | 10/1973 | Ono et al. | 148/175 |

FOREIGN PATENTS OR APPLICATIONS

| | | | |
|---|---|---|---|
| 1,099,098 | 1/1968 | United Kingdom | 148/175 X |

OTHER PUBLICATIONS

Burmeister et al., "Epitaxial Growth of $GaAs_{r-x}P_x$ on Germanium Substrates" Trans. Metall. Soc. of Aime, vol. 245, Mar. 1969, pp. 565-569.
Ladd et al., "Autodoping Effects at the Interface of GaAr–Ge Heterojunctions" Metallurgical Trans., vol. 1, Mar. 1970, pp. 609-616.

Primary Examiner—L. Dewayne Rutledge
Assistant Examiner—W. G. Saba
Attorney, Agent, or Firm—Harold Levine; James T. Comfort; Gary C. Honeycutt

[57] ABSTRACT

The disclosure relates to methods of producing light-emitting (LED) device quality gallium arsenide phosphide on germanium or silicon substrate wafers. In accordance with one embodiment of this disclosure, a germanium substrate is coated with silicon nitride ($Si_3N_4$), boron nitride or silicon dioxide deposited by RF plasma which removes the pinholes which are found in silicon dioxide coatings deposited by standard techniques. The coatings should be of sufficient thickness, with few pinholes and high enough density to prevent passage of HCL gas therethrough and formation of germanium chloride ($GeCl_4$) gas. The silicon nitride is removed from one surface of the substrate and 10 micron layer of gallium arsenide is deposited thereon. A layer of graded gallium arsenide phosphide is then deposited on the gallium arsenide phosphide as in the previous embodiments to provide the completed wafer having a germanium substrate.

4 Claims, 12 Drawing Figures

VAPOR EPITAXIAL METHOD FOR DEPOSITING GALLIUM ARSENIDE PHOSPHIDE ON GERMANIUM AND SILICON SUBSTRATE WAFERS

This is a continuation of application Ser. No. 355,611, filed Apr. 30, 1973 now abandoned.

This invention relates to the fabrication of light-emitting diode (LED) quality gallium arsenide phosphide epitaxial layers on substrates of germanium and silicon and the products of the process.

Light-emitting diodes are presently finding great use in many environments, such as in the read-out sections of small calculators, as small lights and the like. The light-emitting diodes of the prior art have normally included a gallium arsenide substrate with an epitaxial layer of gallium arsenide phosphide deposited thereon. While such prior art light-emitting diode quality wafers have been successfully fabricated and utilized, the use of the gallium arsenide substrate has been found to be relatively expensive and it has therefore been a goal in the art to decrease the cost of light-emitting diode quality substrates. The prior art has attempted to utilize substrates which are less expensive than gallium arsenide and in this regard, the use of a germanium substrate has been attempted with a silicon dioxide coating about all of the faces of the substrate except the face whereupon the epitaxial deposition of gallium arsenide phosphide is to take place. Such an attempt is fully set forth in transactions of the Metallurgical Society of AINE, Volume 245, March 1969 at pages 565–569. The reason for the selection of germanium as a substrate is that this material has a crystal lattice spacing and thermal expansion characteristics which are very close to those of gallium arsenide. Both germanium and gallium arsenide are face-centered cubic crystal structures. Gallium arsenide differs only in that it is a zinc-blend which consists of two different elements, gallium and arsenic. The crystal lattice spacing of germanium is within 0.07 percent of gallium arsenide and the thermal coefficient of expansion varies by only 2.2 percent. However, these prior art attempts have been unsuccessful. It has now been found that the silicon dioxide coating has been full of pinholes and therefore the hydrogen chloride gas placed in the atmosphere during the epitaxial deposition of the gallium arsenide phosphide would pass through the silicon dioxide layer and unite with the germanium to provide a volatile germanium chloride, this germanium then acting as a dopant in the gallium arsenide phosphide layer and degrading the ultimate wafer to the point that it provided very poor light-emitting diode properties. This approach has therefore been discarded, since it is unsatisfactory.

In accordance with the present invention, there has been provided a method of providing and fabricating light-emitting diode quality gallium arsenide phosphide epitaxial layers on either germanium or silicon substrates which are then capable of being utilized to provide high quality light-emitting diode. Briefly, in accordance with the present invention, accordng to one embodiment thereof, a germanium substrate is coated with a layer of gallium arsenide by any one of the techniques known to the art. This layer is preferably in the region of 20 microns in thickness. The coating on one surface of the substrate is then removed. The uncoated surface of the germanium substrate is then coated with a layer of approximately 10 microns of gallium arsenide. It has been found that the HCL gas which is then found in the atmosphere when gallium arsenide phosphide is being epitaxially deposited on the substrate does not pass through the gallium arsenide layer and therefore does not form any germanium chloride and does not cause germanium doping of the gallium arsenide phosphide layer. Accordingly, the gallium arsenide phosphide layer is then epitaxially deposited over the 10 micron gallium arsenide layer to provide the completed high quality epitaxially deposited layer on the substrate.

In accordance with a second embodiment of the invention, a silicon substrate is utilized and a graded region of silicon and germanium is then deposited on one surface thereof, the amount of silicon gradually decreasing to zero in the direction away from the silicon substrate. A gallium arsenide layer is then deposited only over the germanium surface by any of the well-known techniques of the art, this layer being of about 10 microns in thickness. Since the germanium surface is now isolated from the atmosphere, the gallium arsenide phosphide is then deposited in well-known manner and the HCL gas is unable to form a volatile germanium compound to degrade the gallium arsenide phosphde layer. Accordingly, there is now provided a silicon substrate having a gallium arsenide phosphide epitaxial layer thereon for fabrication of LED devices.

In accordance with a third embodiment of the invention, a germanium substrate is coated with silicon nitride ($Si_3N_4$), boron nitride or silicon dioxide deposited by RF plasma which removes the pinholes which are found in silicon dioxide coatings deposited by standard techniques. The coatings must be of sufficient thickness, with few pinholes and high enough density to prevent passage of HCL gas therethrough and formation of germanium chloride ($GeCl_4$) gas. The silicon nitride is removed from one surface of the substrate and 10 micron layer of gallium arsenide is deposited thereon. A layer of graded gallium arsenide phosphide is then deposited on the gallium arsenide phosphide as in the previous embodiments to provide the completed wafer having a germanium substrate.

It is therefore an object of this invention to provide substrates having epitaxially deposited gallium arsenide phosphide thereon which are relatively inexpensive and of LED device quality.

It is a further object of this invention to fabricate LED device quality gallium arsenide phosphide epitaxial layers on germanium substrates.

It is still a further object of this invention to fabricate LED device quality gallium arsenide phosphide epitaxial layers on silicon substrates.

It is yet a further object of this invention to fabricate LED device quality materials which are relatively inexpensive as compared with prior art fabricated materials.

It is a yet further object of this invention to provide a germanium substrate for LED devices which is chemically isolated from HCL gases during wafer fabrication.

It is a further object of this invention to eliminate the formation of volatile germanium and its compounds when epitaxially depositing gallium arsenide phosphide on a substrate.

The above objects and still further objects of the invention will immediately become apparent to those skilled in the art after consideration of the following preferred embodiments thereof, which are provided by way of example and not by way of limitation, wherein.

Figure 1A:
FIGS. 1a–1c are a first embodiment of a method for fabricating an LED device quality gallium arsenide phosphide epitaxial layer on a germanium substrate.
Figure 1B:
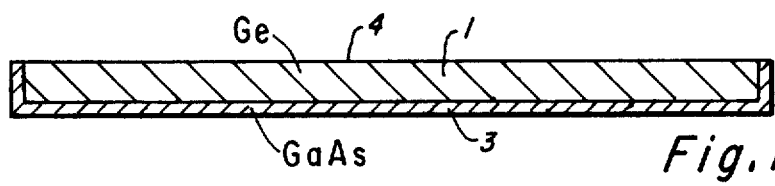
Figure 1C:
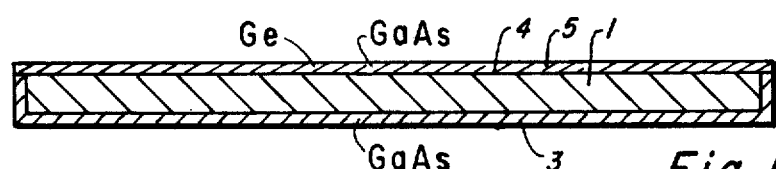

Referring first to FIG. 1, there is shown a method for fabricating a gallium arsenide phosphide layer on germanium. Referring first to FIG. 1a, there is shown a germanium substrate 1. A gallium arsenide layer 3 of about 20 microns is then deposited by any of the well-known methods, such as vapor deposition, over the entire germanium substrate 1 and the upper surface 4 of the germanium substrate is then polished to remove the gallium arsenide therefrom. Polishing is performed externally of the reactor. This is shown in FIG. 1b. The coated substrate is then replaced into the reactor and a thin layer of gallium arsenide 5 is placed over the polished surface 4, this layer being about 10 microns in thickness, as shown in FIG. 1c. Monocrystalline gallium arsenide phosphide is then vapor deposited onto the layer of gallium arsenide 5, the ratio of the phosphorous to the arsenic gradually increasing from zero to 40 percent with the remainder arsenic in the graded region 7 to get away from the lattice mismatch of the alloy of gallium arsenide. The region 9, as shown in FIG. 1d, is gallium arsenide phosphide with about 40 percent phosphorous and 60 percent arsenic. The graded region 7 is about 20 microns in thickness.

It can be seen in accordance with the embodiment of FIGS. 1a–1d, that when the gallium arsenide phosphide is vapor deposited, the HCL gas which accompanies the gallium arsenide phosphide into the reactor has no way of attacking the germanium substate since the germanium substrate is always encapsulated within the gallium arsenide outer layer thereon. Accordingly, there can be no doping of the gallium arsenide phosphide layer with the detrimental germanium impurity to degrade the ultimate device to be fabricated therefrom.

Under test in a series of depositions made over a range of temperatures at a constant III–V ratio of approximately 1.0, results revealed a marked decrease in the density of crystallographic defects in the deposit-substrate interphase at the lower growth temperatures. At a substrate temperature which was about 750° C. and lower, these defects were no longer evident.

While germanium having a crystallographic orientation 2° off (100) is preferred, other orientations will also work.

Figure 1D:
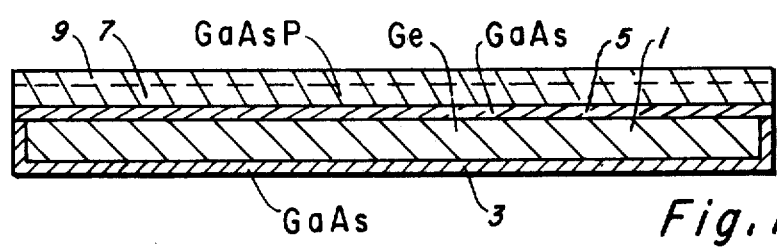
Figure 2A:
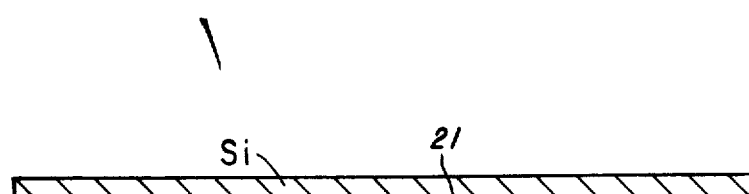
FIGS. 2a–2d are a second embodiment of the invention wherein LED device quality gallium arsenide phosphide epitaxial layers are fabricated on silicon.
Figure 2B:
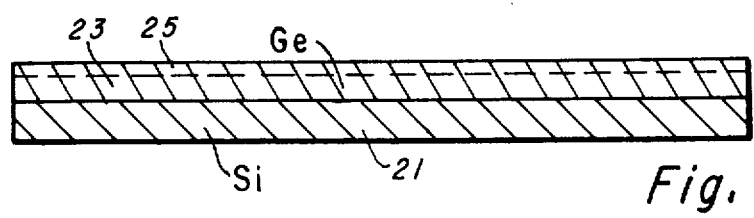
Figure 2C:
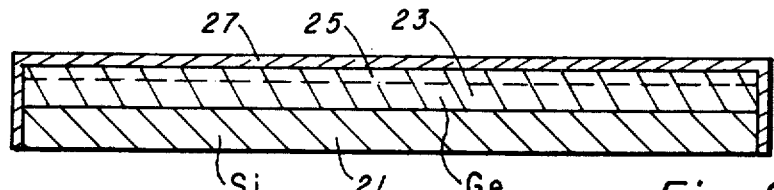
Figure 2D:
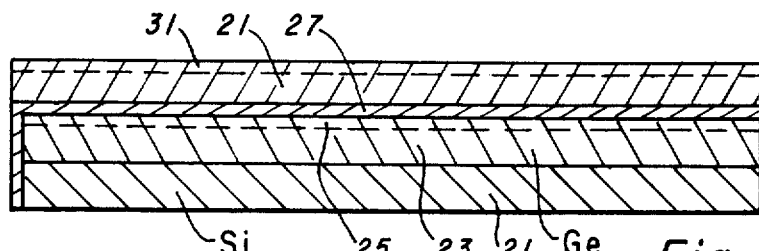

Referring now to FIGS. 2a–2d, there is shown a second embodiment of the invention. In accordance with this embodiment, a silicon substrate 21 is provided as shown in FIG. 2a. Silicon does not form any volatile compounds with materials entered into the reactor when depositing layers of gallium arsenide or gallium arsenide phosphide. This substrate is then coated on an upper surface as shown in FIG. 2b with a germanium layer 25 over a graded region 23 wherein the amount of silicon gradually diminishes from 100 percent up to zero percent wherein the germanium layer 25 begins. A layer of gallium arsenide 27 is then deposited over the layer 25 as shown in FIG. 2c in the same manner as stated above, with respect to FIG. 1c, the layer 27 extending over the sides of the germanium containing layers 23 and 25 and completely encapsulating the germanium. A graded region of gallium arsenide phosphide 29, the same as the region 7 of FIG. 1d, is then deposited over the gallium arsenide layer 27 and the layer 31 is then a gallium arsenide phosphide layer having 40 percent phosphorous and 60 percent arsenic to provide the completed material as shown in FIG. 2d. It can be seen in accordance with the embodiment of FIGS. 2a–2d that there is provided a silicon substrate having a gallium arsenide phosphide epitaxially deposited layer 29 and 31 thereon, as desired.

Figure 3A:
FIGS. 3a–3d are a third embodiment of the invention wherein LED device quality gallium arsenide phosphide epitaxial layers are fabricated on germanium substrates.
Figure 3B:
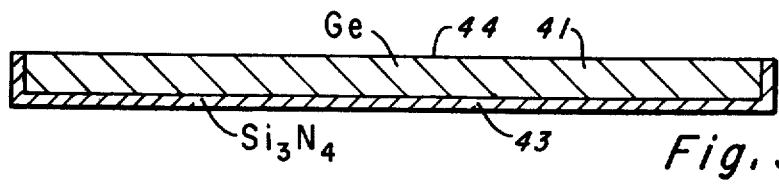
Figure 3C:
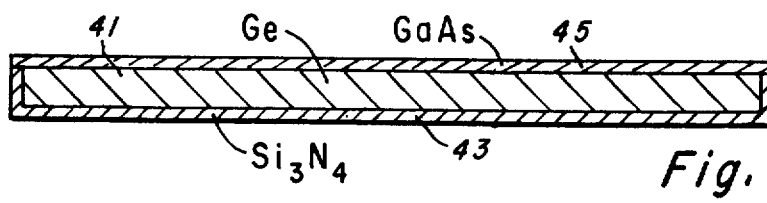
Figure 3D:
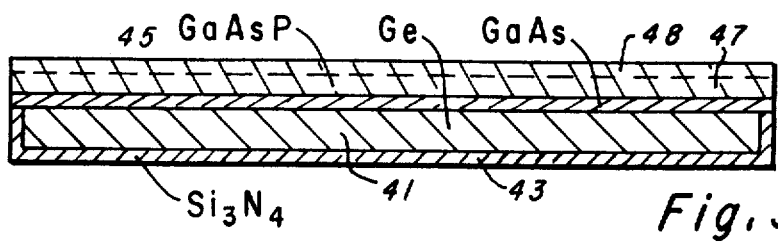

Referring now to FIGS. 3a–3d, there is shown a third embodiment of the invention. In FIG. 3a, there is shown a germanium crystal wafer 41 which is the starting base material. This base material is then coated on all sides by a silicon nitride coating of sufficient thickness and with very few pinholes and of high enough density to make an effective mask. It should be understood that whatever nitride is mentioned, boron nitride and silicon dioxide deposited by RF plasma also apply. The silicon nitride is removed from the upper layer 44, as shown in FIG. 3b, and a layer 45 of gallium arsenide is deposited thereon in the same manner as in the previous embodiments, as shown in FIG. 3c. The process then proceeds by depositing a layer of gallium arsenide phosphide wherein the layer 47 of FIG. 3d is a graded region, the same as in FIGS. 1d and 2d, and the layer 49 includes gallium arsenide phosphide having 40 percent phosphorous and 60 percent arsenic to complete the device. It can be seen that the embodiment of FIGS. 3a–3d provides a gallium arsenide phosphide layer atop a germanium substrate with no possibility of the HCL gas, which enters into the reactor during deposition of the gallium arsenide phosphide, forming detrimental germanium chloride or in any way reaching the germanium substrate to form the detrimental dopants which degrade the ultimate device.

It should be understood that wherever layer thicknesses have been provided herein, there are minimum thicknesses. Thicker layers will work also and possibly thinner layers, the criterion being the masking ability of the layer.

It should also be understood that any other coating can be used which is chemically inert with regard to the materials used in the process steps and which is sufficiently pinhole free to thoroughly mask the germanium.

Though the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

What is claimed is:

1. A method of forming a wafer of semiconductor material which comprises the steps of:
   a. providing a substrate having a germanium surface region with at least one surface;
   b. coating the entire germanium region with a totally pinhole-free coating of silicon nitride;
   c. selectively removing said coating from a portion of said surface;
   d. coating said portion with epitaxial gallium arsenide; and
   e. coating said gallium arsenide with a graded epitaxial layer of gallium arsenide phosphide, said graded layer going from zero percent to 40 percent phosphorous and from 100 percent to 60 percent arsenic.

2. A method as set forth in claim 1 wherein said substrate provided in step (a) is germanium.

3. A method as set forth in claim 1 wherein said coating in step (b) is at least 20 microns in thickness.

4. A method as set forth in claim 2 wherein said coating in step (b) is at least 20 microns in thickness.

* * * * *